(12) United States Patent
Li et al.

(10) Patent No.: US 8,012,874 B2
(45) Date of Patent: Sep. 6, 2011

(54) SEMICONDUCTOR CHIP SUBSTRATE WITH MULTI-CAPACITOR FOOTPRINT

(75) Inventors: Yue Li, Markham (CA); Silqun Leung, Richmond Hill (CA); Terence Cheung, Toronto (CA); Sally Yeung, Toronto (CA); Liane Martinez, North York (CA)

(73) Assignee: ATI Technologies ULC, Markham (CA)

( * ) Notice: Subject to any disclaimer, the term of this patent is extended or adjusted under 35 U.S.C. 154(b) by 213 days.

(21) Appl. No.: 11/956,434

(22) Filed: Dec. 14, 2007

(65) Prior Publication Data

US 2009/0152690 A1    Jun. 18, 2009

(51) Int. Cl.
*H01L 21/44* (2006.01)

(52) U.S. Cl. ........................................ 438/666; 438/381

(58) Field of Classification Search ............... 438/171, 438/190, 238, 239, 243, 244, 253, 329, 386, 438/387, 393, 396, 381, 666
See application file for complete search history.

(56) References Cited

U.S. PATENT DOCUMENTS

| | | | | |
|---|---|---|---|---|
| 5,043,533 A | * | 8/1991 | Spielberger | 174/539 |
| 2002/0074653 A1 | * | 6/2002 | Khandros et al. | 257/724 |
| 2006/0108607 A1 | * | 5/2006 | Teshima et al. | 257/207 |
| 2006/0138591 A1 | * | 6/2006 | Amey et al. | 257/532 |

OTHER PUBLICATIONS

Toshisumi Yoshino et al.; Hitachi Chemical Co., Ltd.; *Advanced Photo-definable Solder Mask for High-performance Semiconductor Packages*; Jan. 2006; pp. 29-34.
Taiyo Ink Mfg. Co., Ltd.; *PSR-4000 AUS703 Material Safety Sheet*; Oct. 19, 2007; pp. 1-6.

* cited by examiner

*Primary Examiner* — S. V Clark
(74) *Attorney, Agent, or Firm* — Timothy M. Honeycutt

(57) ABSTRACT

Various methods and apparatus for coupling capacitors to a chip substrate are disclosed. In one aspect, a method of manufacturing is provided that includes forming a mask on a semiconductor chip substrate that has plural conductor pads. The mask has plural openings that expose selected portions of the plural conductor pads. Each of the plural openings has a footprint corresponding to a footprint of a smallest size terminal of a capacitor adapted to be coupled to the semiconductor chip substrate. A conductor material is placed in the plural openings to establish plural capacitor pads.

13 Claims, 6 Drawing Sheets

SEMICONDUCTOR CHIP SUBSTRATE WITH MULTI-CAPACITOR FOOTPRINT

BACKGROUND OF THE INVENTION

1. Field of the Invention

This invention relates generally to semiconductor processing, and more particularly to methods and apparatus for connecting capacitors to substrates.

2. Description of the Related Art

All integrated circuits require electrical power to operate, and packaged integrated circuits, which consist of a semiconductor chip mounted on a package substrate, are no exception. Power is normally delivered to integrated circuits via a power supply and some form of power delivery network. Although currently-available power supplies are designed to supply stable voltages, the actual power delivered to integrated circuits can contain significant amounts of noise. There are many sources of noise, such as voltage fluctuations caused by other devices coupled to the power supply, electromagnetic interference and other causes.

Packaged integrated circuits use decoupling capacitors to lower noise on the power supply. Some of these decoupling capacitors are located on the package substrate. A typical conventional decoupling capacitor consists of a stack of plates commonly connected to two terminals. The capacitor is mounted to a package substrate by way of a pair of solder capacitor pads: one for each terminal. The capacitor pads are positioned on and electrically connected to corresponding conductor pads. The conductor pads are connected to various conductor lines or traces in the substrate that link up electrically with the semiconductor chip.

In a typical conventional substrate, multiple conductor pads are fabricated with different sizes tailored to match different physical sizes of capacitors. The conventional solder capacitor pads are sized to closely match the sizes of the underlying conductor pads. For example, two large solder pads are fabricated on two large underlying conductor pads to accommodate a large two terminal capacitor. Conversely, two small solder pads are fabricated on two small underlying conductor pads to accommodate a small two terminal capacitor.

After the conductor pad layout for a package substrate is selected, the designer makes an estimate of the decoupling capacitance required for the combination of the package substrate and a particular semiconductor chip. The estimate is based on experience, rules of thumb, and simulations. With an estimate in hand, the designer then selects a collection of capacitors that provide the estimated decoupling capacitance for connection to the solder capacitor pads.

A difficulty can arise where the actual required decoupling capacitance does not match the estimated decoupling capacitance. If, for example, the estimated decoupling capacitance turns out to be too large, the excessive capacitance may result in excessive damping. In this circumstance, it would be desirable to lower the actual decoupling capacitance for the substrate. One conventional technique to solve the problem involves a costly and time consuming redesign of the substrate. Another technique involves attempting to retrofit different sized capacitors to the substrate to raise or lower the actual total decoupling capacitance. Since the conventional solder capacitor pads are sized to correspond to the sizes of the underlying conductor pads, the retrofit often involves trying to place a small capacitor on a large solder capacitor pad. If small capacitor-to-large capacitor pad alignment is off, or if the large solder capacitor pad has any stringers, open or short circuit conditions can occur.

The present invention is directed to overcoming or reducing the effects of one or more of the foregoing disadvantages.

SUMMARY OF THE INVENTION

In accordance with one aspect of the present invention, a method of manufacturing is provided that includes forming a mask on a semiconductor chip substrate that has plural conductor pads. The mask has plural openings that expose selected portions of the plural conductor pads. Each of the plural openings has a footprint corresponding to a footprint of a smallest size terminal of a capacitor adapted to be coupled to the semiconductor chip substrate. A conductor material is placed in the plural openings to establish plural capacitor pads.

In accordance with another aspect of the present invention, a method of manufacturing includes providing a semiconductor chip substrate that has plural conductor pads and is adapted to have a semiconductor chip coupled thereto. A mask is formed on a semiconductor chip substrate that has plural conductor pads. The mask has plural openings that expose selected portions of the plural conductor pads. Each of the plural openings has a footprint corresponding to a footprint of a smallest size terminal of a capacitor adapted to be coupled to the semiconductor chip substrate. A conductor material is placed in the plural openings to establish plural capacitor pads. A requisite decoupling capacitance is determined for a combination of the semiconductor chip package and the semiconductor chip. Plural capacitors are coupled to the semiconductor chip substrate. The plural capacitors collectively have the requisite decoupling capacitance. Each of the plural capacitors is coupled to at least two of the plural capacitor pads. At least one of the plural capacitors has the smallest size terminal.

In accordance with another aspect of the present invention, an apparatus is provided that includes a semiconductor chip substrate that has plural conductor pads. An insulating layer is on the semiconductor chip substrate. The insulating layer has plural openings to selected portions of the plural conductor pads. Each of the plural openings has a footprint corresponding to a footprint of a smallest size terminal of a capacitor adapted to be coupled to the semiconductor chip substrate. Plural capacitor pads are positioned in corresponding of the plural openings.

In accordance with another aspect of the present invention, an apparatus is provided that includes a semiconductor chip substrate that has a first pair of conductor pads and a second pair of conductor pads. Each of the first pair of conductor pads has a first size and each of the second pair of conductor pads has a second size larger than the first size. An insulating layer is on the semiconductor chip substrate. The insulating layer has a first opening to a first of the first pair of conductor pads and a second opening to the second of the first pair of conductor pads. The insulating layer has at least two openings to selected portions of a first of the second pair of conductor pads and at least two openings to selected portions of the second of the second pair of conductor pads. Each of the plural openings has a footprint corresponding to a footprint of a smallest size terminal of a capacitor adapted to be coupled to the semiconductor chip substrate. A capacitor pad is positioned in each of the first opening, the second opening, and the at least two openings to each of the second pair of conductor pads.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
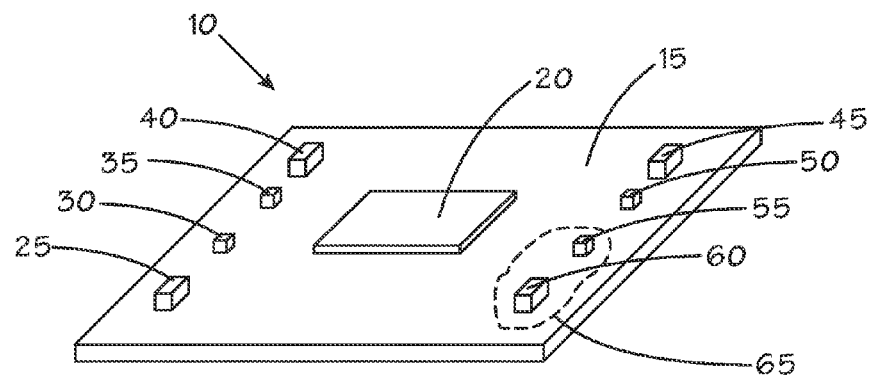
FIG. 1 is a pictorial view of an exemplary conventional semiconductor chip package that includes a substrate upon which a semiconductor chip is mounted.

In the drawings described below, reference numerals are generally repeated where identical elements appear in more than one figure. Turning now to the drawings, and in particular to FIG. 1, therein is shown a pictorial view of an exemplary conventional semiconductor chip package 10 that includes a substrate 15 upon which a semiconductor chip 20 is mounted. The substrate 15 includes several capacitors 25, 30, 35, 40, 45, 50, 55 and 60 that are of various sizes. The capacitors 30, 35, 50 and 55 are smaller in physical size than the capacitors 25, 40, 45 and 60. The capacitors 25, 30, 35, 40, 45, 50, 55 and 60 are linked electrically to the semiconductor chip 20 by way of a plurality of conductor traces and lines that are not visible in FIG. 1.

Figure 2:
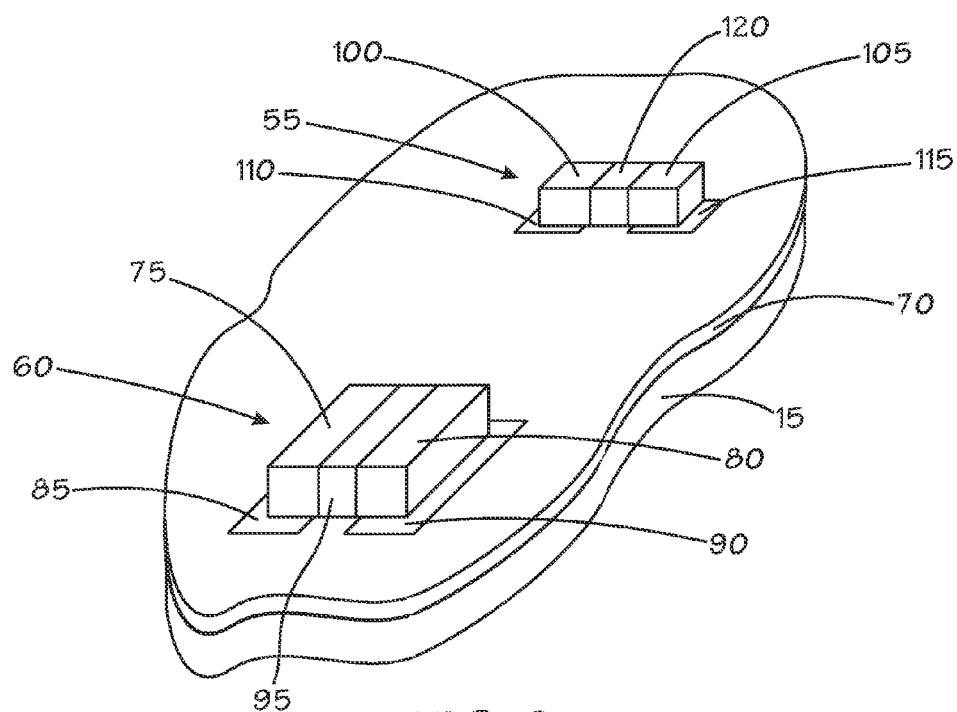
FIG. 2 is a small portion of FIG. 1 shown at greater magnification.

A small portion of the substrate 15 that includes the capacitors 55 and 60 is circumscribed by an irregular dashed oval 65. The portion circumscribed by the dashed oval 65 is shown in pictorial form and at greater magnification in FIG. 2. Attention is now turned to FIG. 2. The substrate 15 is topped with an insulating material layer 70. The capacitor 60 includes terminals 75 and 80 that are soldered to respective pads 85 and 90. The central portion 95 of the capacitor 60 is typically an insulating material coating that may be a plastic or a potted epoxy. The capacitor 55 includes respective terminals 100 and 105 soldered to respective pads 110 and 115. A central portion 120 of the capacitor 55 is configured like the central portion 95 of the capacitor 60. The pads 85, 90, 110 and 115 for the capacitors 60 and 55 consist of solder structures that are configured as islands surrounded by the insulating material layer 70. As described in conjunction with FIGS. 3 and 4 below, there are additional conductor pads positioned beneath the solder pads 85, 90, 110 and 115 that are not visible in FIGS. 1 and 2.

Figure 3:
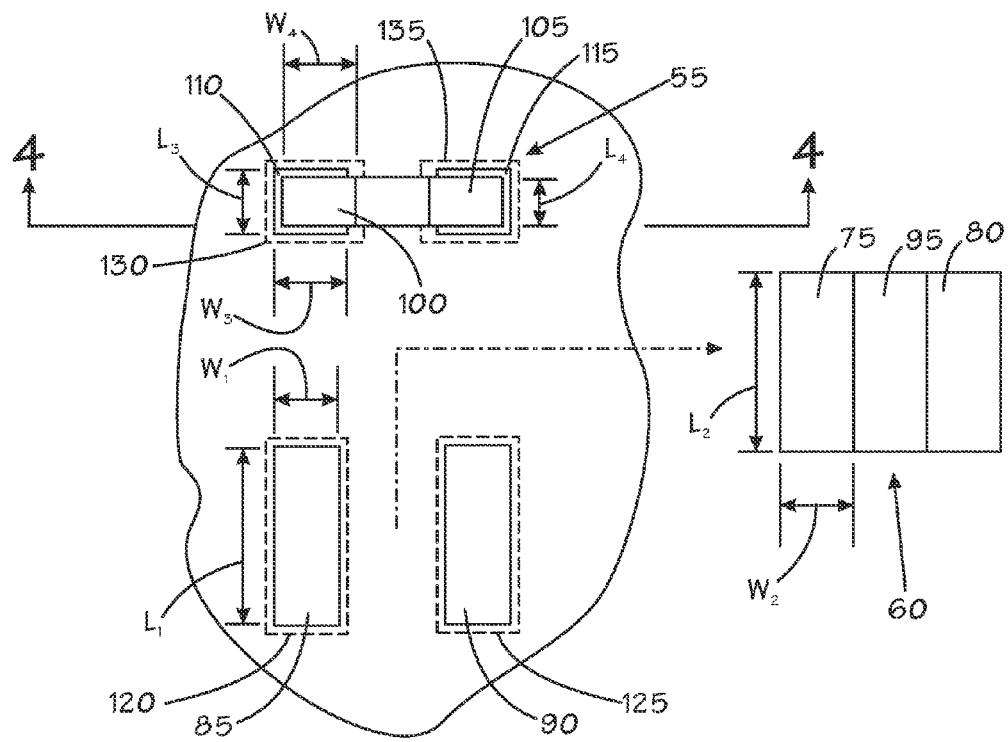
FIG. 3 is an overhead of the portion depicted in FIG. 2.

Additional details of the capacitors 55 and 60 and the substrate 15 may be understood by referring now to FIG. 3, which is an overhead view of the small portion of the substrate 15 in FIG. 1 circumscribed by the dashed oval 65. To reveal certain details, the capacitor 60 is shown exploded away from the substrate 15. The solder pads 85 and 90 are each fabricated with a length $L_1$ and width $W_1$ appropriate to match the length $L_2$ and width $W_2$ and of one or both of the terminals 75 and 80 (shown on opposite sides of the central portion 95) of the capacitor 60. Two conductor pads 120 and 125, both shown in dashed, are buried beneath the insulating material layer 70. The conductor pad 120 is positioned beneath the solder pad 85 and the conductor pad 125 is positioned beneath the solder pad 90. The capacitor 55 is shown positioned on the solder pads 110 and 115. The solder pads 110 and 115 are provided with respective $L_3$ lengths and widths $W_3$ that are appropriate to accommodate the terminals 100 and 105 of the capacitor 55 that each have a length $L_4$ and width $W_4$. A conductor pad 130, shown in dashed, is positioned beneath the solder pad 110 and another conductor pad 135, shown in dashed, is positioned beneath the solder pad 115.

Figure 4:
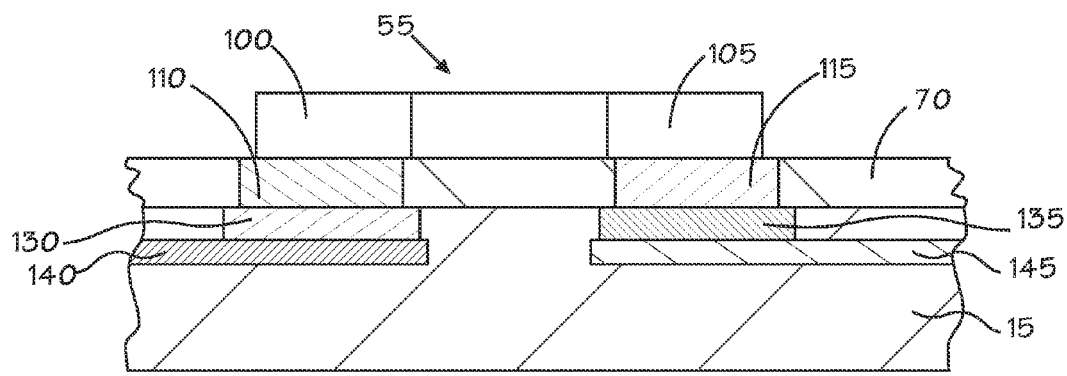
FIG. 4 is a sectional view of FIG. 3 taken at section 4-4.

Additional detail of the substrate 15 may be understood by referring now to FIG. 4, which is a sectional view of FIG. 3 taken at section 4-4. Before discussing FIG. 4 in detail, it should be noted that section 4-4 of FIG. 3 passes through the substrate 15 but does not pass through the capacitor 55. Thus the capacitor 55 is not shown in section in FIG. 4. Turning now to FIG. 4, the conductor pads 130 and 135 are connected from above to the solder pads 110 and 115. Respective conductor traces or lines 140 and 145 are connected to the conductor pads 130 and 135. There may be many such conductor traces or lines in the substrate 15 that connect the conductor pads 130 and 135 to other circuit structures. Thus, electrical pathways are established between the terminal 100 of the capacitor 55 and the trace 140 by way of the solder pad 110 and the conductor pad 130. A complimentary electrical pathway is established between the terminal 105 of the capacitor 55 and the conductor trace 145 by way of the solder pad 115 and the conductor pad 135. Again, the insulating material layer 70 provides a lateral electrical isolation for the solder pads 110 and 115.

Figure 5:
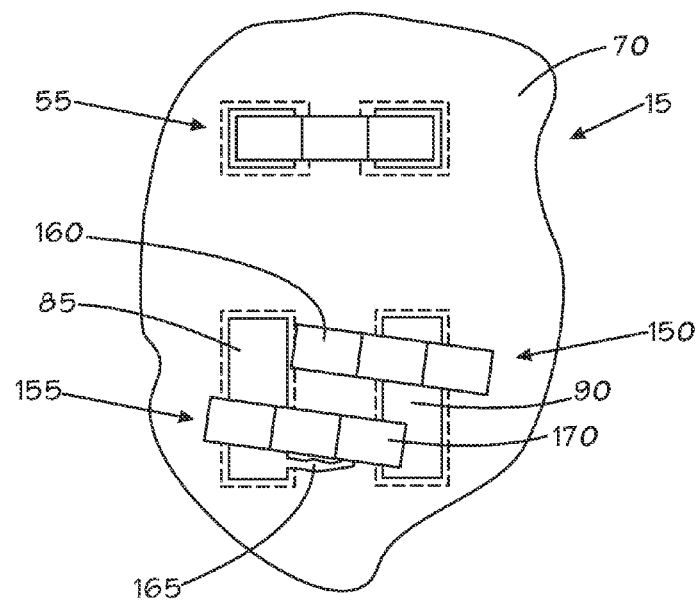
FIG. 5 is an overhead view like FIG. 3 but depicting a different arrangement of capacitors.

As noted in the Background section hereof, package substrate designers make an initial estimate as to the capacitive requirements for a given substrate-semiconductor chip combination. A collection of capacitors is then selected to meet the anticipated capacitive requirements. The capacitors may be of different sizes, such as the capacitors 55 and 60 described elsewhere herein, and thus the size of the solder pads to accommodate the different sized capacitors is built into the design of the substrate. Thus, the sizes of the solder pads 85, 90, 110 and 115 are selected to accommodate the different sized capacitors 55 and 60 as well as the other capacitors 25, 30, 35, 40, 45 and 50 on the substrate depicted in FIG. 1. Of course a difficulty associated with the conventional design technique becomes apparent when the initial estimates for the capacitance requirements are off by some measure and attempts are made to more closely optimize the capacitance provided to the package substrate. One conventional technique for attempting to optimize on-substrate capacitance is to retrofit small sized capacitors to large sized solder pads. FIG. 5 depicts an overhead view of such a conventional attempt at a capacitor retrofit. FIG. 5 depicts an overhead view of the same small portion of a conventional substrate 15 that has the capacitor 55 mounted thereto as shown and described elsewhere herein. In addition, the solder pads 85 and 90 are configured as described elsewhere herein. However, FIG. 5 illustrates an attempted retrofit in which two small sized capacitors 150 and 155 that may be the same size and shape as the capacitor 55 are placed on the larger sized solder pads 85 and 90. Two pitfalls that can arise in situations where a capacitor retrofit it attempted using the conventionally sized solder pads 85 and 90 are illustrated. Regarding the first, note that the capacitor 150 is misaligned with the solder pads 85 and 90 so that a terminal 160 of the capacitor 150 does not establish ohmic contact with the solder pad 85 and thus creates an open circuit situation. As to the second pitfall illustrated, note that the pad 85 includes an unwanted stringer 165 of solder that extends across the surface of the insulating material layer 70 and establishes a short with a terminal 170 of the capacitor 155.

Figure 6:
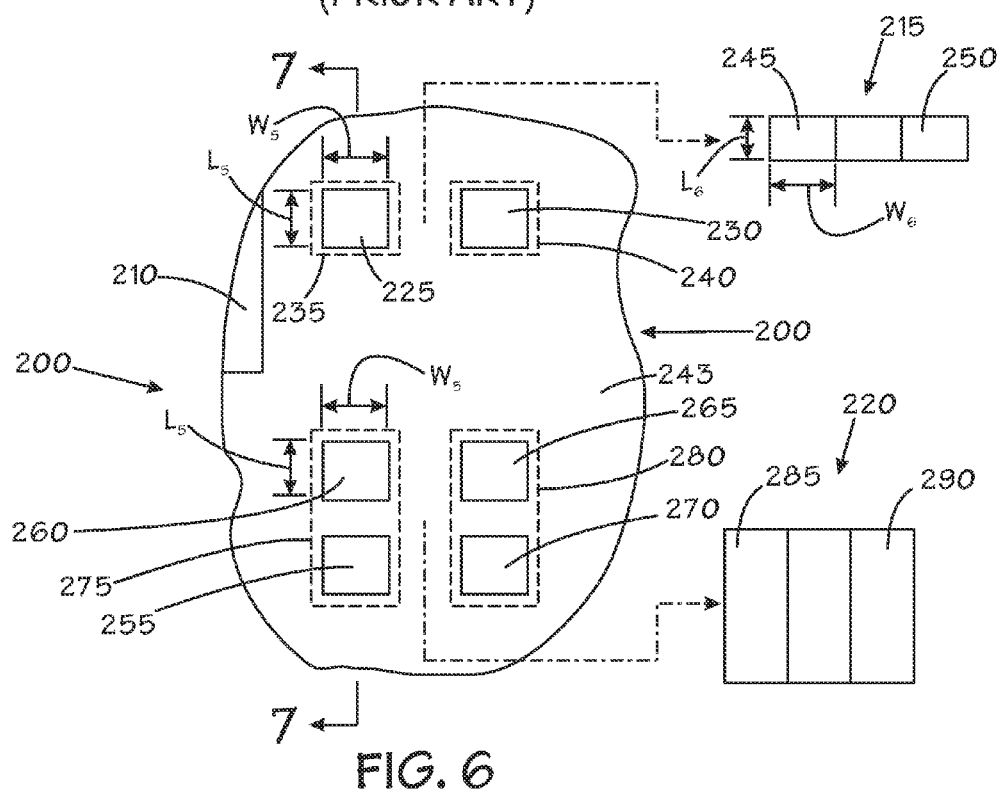
FIG. 6 is an overhead view of a small portion of an exemplary embodiment of a semiconductor chip substrate that includes multiple capacitor pads.

FIG. 6 is an overhead view of a small portion of an exemplary embodiment of a semiconductor chip package substrate 200 that is suitable to support a semiconductor chip 210, only a portion of which is visible. The substrate 200 may be composed of ceramic or organic materials as desired. If organic, the substrate 200 may actually consist of multiple layers of metallization and dielectric materials that electrically interconnect the semiconductor chip 210 to some other component, such as a board (not shown). The substrate 200 may interconnect electrically with external devices, such as another circuit board, in a variety of ways, such as via a pin grid array, a land grid array, a ball grid array or other configuration. The number of individual layers for the substrate 200 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 200 could be configured as something other than a package substrate, such as a printed circuit board serving as a motherboard, a daughter board, a card or some other type of board.

The semiconductor chip 210 may be fashioned as a semiconductor chip that is mounted to the substrate 200 in a flip-chip configuration, a wire-bond mounting or other type of mounting. The semiconductor chip 210 may be any of a myriad of different types of circuit devices used in electronics, such as, for example, microprocessors, graphics processors, application specific integrated circuits, memory devices or the like, and may be single or multi-core. The semiconductor chip 210 may be fabricated using silicon, germanium or other semiconductor materials. If desired, the chip 210 may be fabricated as a semiconductor-on-insulator substrate. The semiconductor chip 210 may be electrically interconnected with the substrate 200 by a plurality of conductor structures that are not visible in FIG. 6. If desired, more than one semiconductor chip may be coupled to the substrate 200.

The package substrate 200 may be provided with a plurality of different sized capacitors, two of which are shown removed from the substrate 200 and labeled 215 and 220 respectively. The substrate 200 is provided with a pair of solder pads 225 and 230 that are positioned over respective conductor pads 235 and 240 (shown in dash) and electrically isolated laterally by an insulating material layer 243. The solder pads 225 and 230 are designed to metallurgically bond two terminals 245 and 250 of the capacitor 215. The solder pads 225 and 230 may be formed with a footprint that corresponds to the footprint of the smallest size terminal of a capacitor adapted to be used with the substrate 200. For example, the solder pads 225 and 230 may be formed with rectangular footprints defined by a length $L_5$ and a width $W_5$ that is appropriate to accommodate the length $L_6$ and width $W_6$ of the terminals 245 and 250 of the capacitor 215. For example, the capacitor 215 may represent the smallest physical size of capacitor terminal that will be used with the substrate 200. The nominal dimensions $L_5$ and $W_5$ for a solder pad may be used in other areas of the substrate 10 to metallurgically bond with other than the smallest anticipated capacitor. For example, four solder pads 255, 260, 265 and 270 may be formed on underlying conductor pads 275 and 280 (shown in dashed) wherein the solder pads 255 and 260 are positioned on the conductor pad 275 and the solder pads 265 and 270 are positioned on the conductor pad 280. The pads 255, 260, 265 and 270 may be formed with the same nominal dimensions $L_5$ and $W_5$ even though the underlying conductor pads 275 and 280 are fabricated with much larger sizes that would be appropriate for the conventionally sized large solder pads of the type depicted in FIG. 3 and labeled 85 and 90 respectively. Here, a common relatively small size capacitor solder pad is used in different locations to provide greater flexibility in the sizes and capacitive capacities of capacitors that may be secured thereto. Thus, a terminal 285 of the larger sized capacitor 220 may be metallurgically bonded to the solder pads 255 and 260 and the other terminal 290 metallurgically bonded to the solder pads 265 and 270. Optionally, two smaller sized capacitors, such as the capacitor 215 and another like it, could be mounted to the grouping of pads 260 and 265 and 255 and 270 to provide a different capacitance value.

Figure 7:
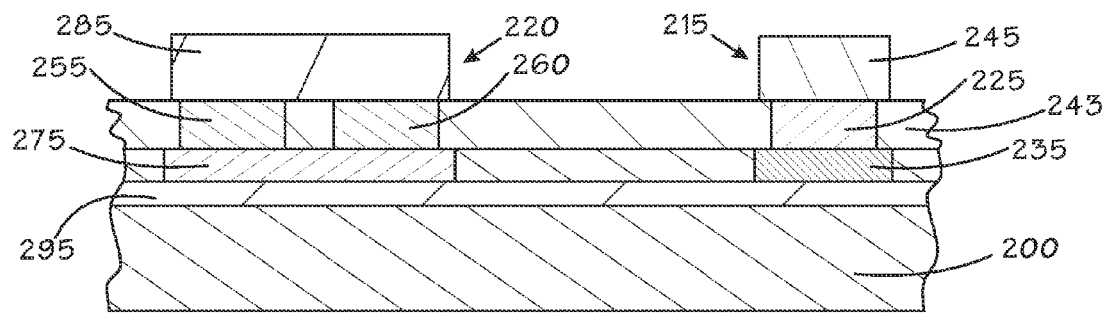
FIG. 7 is a sectional view of FIG. 6 taken at section 7-7.

Additional detail of the package substrate 200 may be understood by referring now to FIG. 7, which is a sectional view of FIG. 6 taken at 7-7. It should be understood that FIG. 7 depicts portions of the capacitors 215 and 220 in position on the substrate 200 instead of exploded therefrom as is the case in FIG. 6. In particular, the terminal 285 of the capacitor 220 is shown in section and the terminal 245 of the capacitor 215 is shown in section. The insulating material layer 243 overlies the substrate 200 and electrically isolates the solder pads 255, 260 and 225 laterally. The solder pads 255 and 260 are metallurgically bonded to the underlying conductor pad 275. Another conductor trace or line 295 is positioned below but in ohmic contact with the conductor pad 275. The line 295 may be a conductor trace or line or some other type of conductor. Thus, a conducting pathway is established between the terminal 285 and the conductor line 295 by way of the solder pads 255 and 260 and the conductor pad 275. The solder pad 225 is connected electrically to the underlying conductor pad 235, which is, in turn, in ohmic contact with the conductor line 295. Thus, a conducting pathway is established between the terminal 245 and the conductor 295 by way of the solder pad 225 and the conductor pad 235. Thus, the terminals 285 and 245 are commonly connected via the conductor 295. Of course, the terminals 285 and 245 need not be tied together via a conductor such as the conductor 295. Furthermore, the conductor 295 may be held at any potential state.

Figure 8:
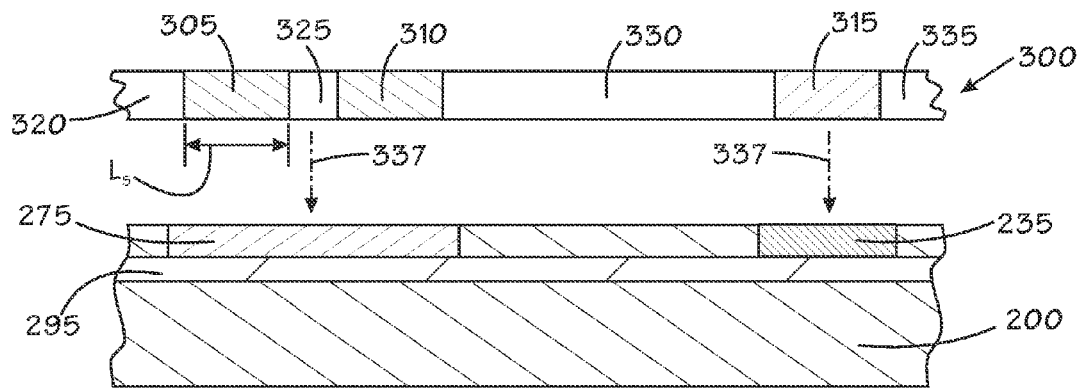
FIG. 8 is a sectional view like FIG. 7, but depicting placement of a stencil on the semiconductor chip substrate.

An exemplary process for fabricating the solder pads 255, 260 and 225 may be understood by referring now to FIGS. 8, 9, 10 and 11, and initially to FIG. 8, which is a sectional view of the package substrate 200 prior to the application of the insulating material layer 243 but after the manufacture of the conductor pads 275 and 235 and the conductor line 295. A stencil 300 is fabricated with openings 305, 310 and 315 that are provided with a length $L_5$ and a width equal to the width $W_5$ (see FIG. 6) along an axis coming out of the page. The areas 320, 325, 330 and 335 lateral to the blocks 305, 310 and 315 are open to allow an insulating material layer to be deposited therein during a stenciling process. As indicated by the arrows 337, the stencil 300 is placed on the substrate 200 so that the blocks 305 and 310 are positioned over the conductor pad 275 and the block 315 is positioned over the conductor pad 235.

Figure 9:
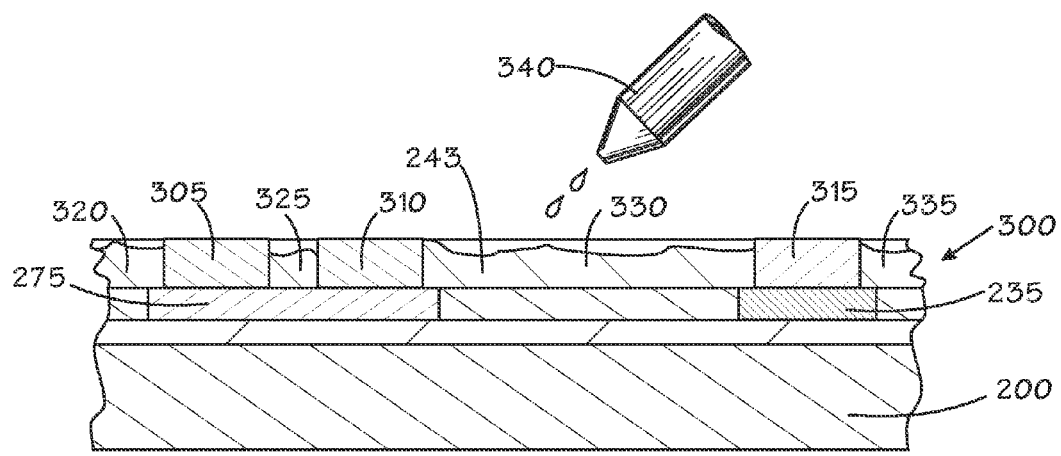
FIG. 9 is a sectional view like FIG. 8 depicting placement of an insulating material on the semiconductor chip substrate.

Attention is now turned to FIG. 9. With the stencil 300 in place on the substrate 200, an insulating material 243 is pressed in to fill the openings 320, 325, 330 and 335 while the blocks 305, 310 and 315 prevent insulating material 243 from being deposited on selected portions of the pads 275 and 235. Insulating material 243 may be deposited by a dispenser 340 or some other mechanism. The insulating material 243 may be composed of a variety of insulating materials, such as, for example PSR-4000 AUS703 manufactured by Taiyo Ink Mfg. Co., Ltd. or SR7000 manufactured by Hitachi Chemical Co., Ltd. The stencil 300 may be composed of well-known ceramic or plastic materials.

Figure 10:
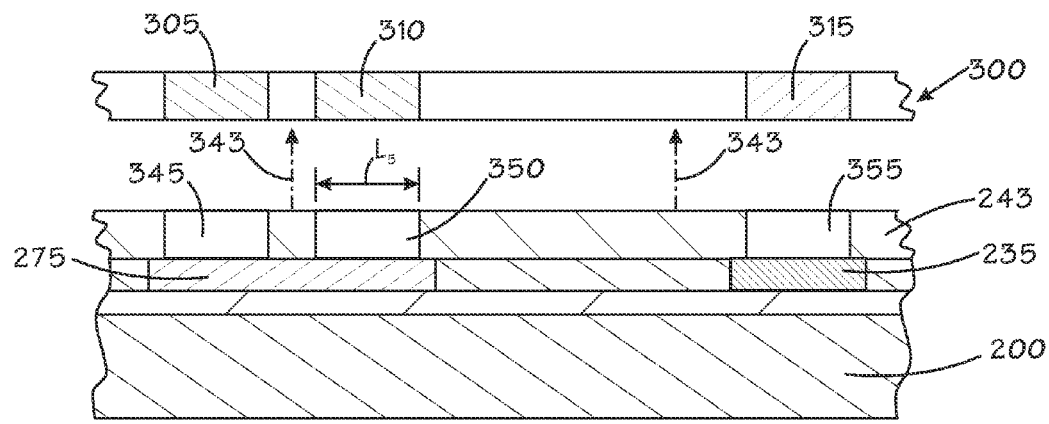
FIG. 10 is a sectional view like FIG. 9 depicting removal of the stencil.

Attention is now directed to FIG. 10. After the insulting material 243 is forced into the stencil 300, the stencil 300 is removed as suggested by the arrows 343 to leave the insulating material 243 with openings 345, 350 and 355 that are positioned where the blocks 305, 310 and 315 of the stencil 300 were formally positioned on the substrate 200. The openings 345, 350 and 355 may each have a footprint, defined in this embodiment by the lateral dimension $L_5$ and an orthogonal dimension $W_5$ along an axis coming out of the page as defined elsewhere herein, that is based on the footprint of a terminal of the smallest capacitor contemplated for the substrate 200. The openings 345 and 350 expose portions of the underlying conductor pad 275 and the opening 355 exposes a portion of the underlying conductor pad 235.

Figure 11:
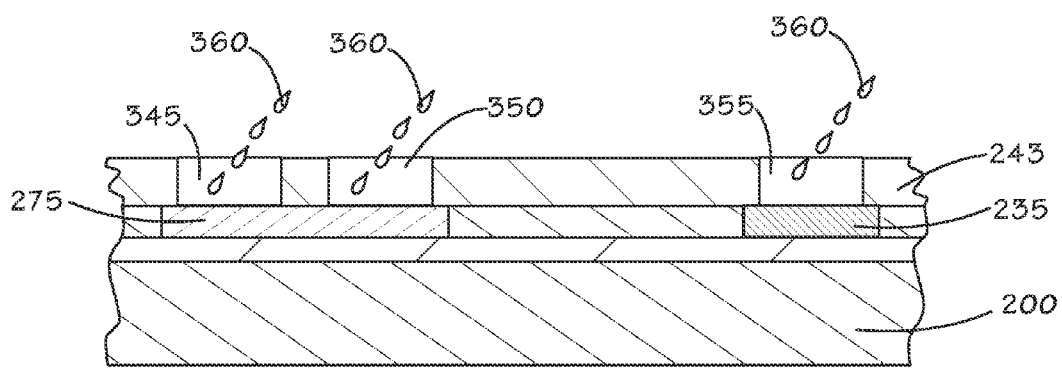
FIG. 11 is a sectional view like FIG. 10 depicting an exemplary process of forming capacitor pads on the semiconductor chip substrate.

The package substrate 200 is now ready to receive solder to form capacitor pads in the openings 345, 350 and 355 with the insulating layer 243 acting as a mask. In this regard, FIG. 11 depicts solder 360 being deposited in the openings 345, 350 and 355 of the insulating material layer 243. The solder 360 is deposited until the openings 345, 350 and 355 are completely or substantially filled. The solder 360 establishes initial metallurgical bonding with the underlying conductor pads 275 and 235. With the solder 360 in place, the capacitors 220 and 215 may be positioned on the solder pads 255 and 260 and the capacitor 215 may be positioned on the solder pad 225 as depicted in FIG. 7 and a solder reflow may be performed to establish a requisite metallurgical bonding between the capacitors 220 and 215 and the fully formed pads 255, 260 and 225. The solder 360 may be composed of lead-free solders, such as tin-silver, tin-copper or the like. In an exemplary embodiment, the solder 360 may be about 97% tin and about 3% silver. The reflow parameters will depend on the melting temperature of the solder. In an exemplary embodiment, the semiconductor chip substrate 200 may be heated to about 150° C. for about 15 minutes to accomplish the reflow.

Figure 12:
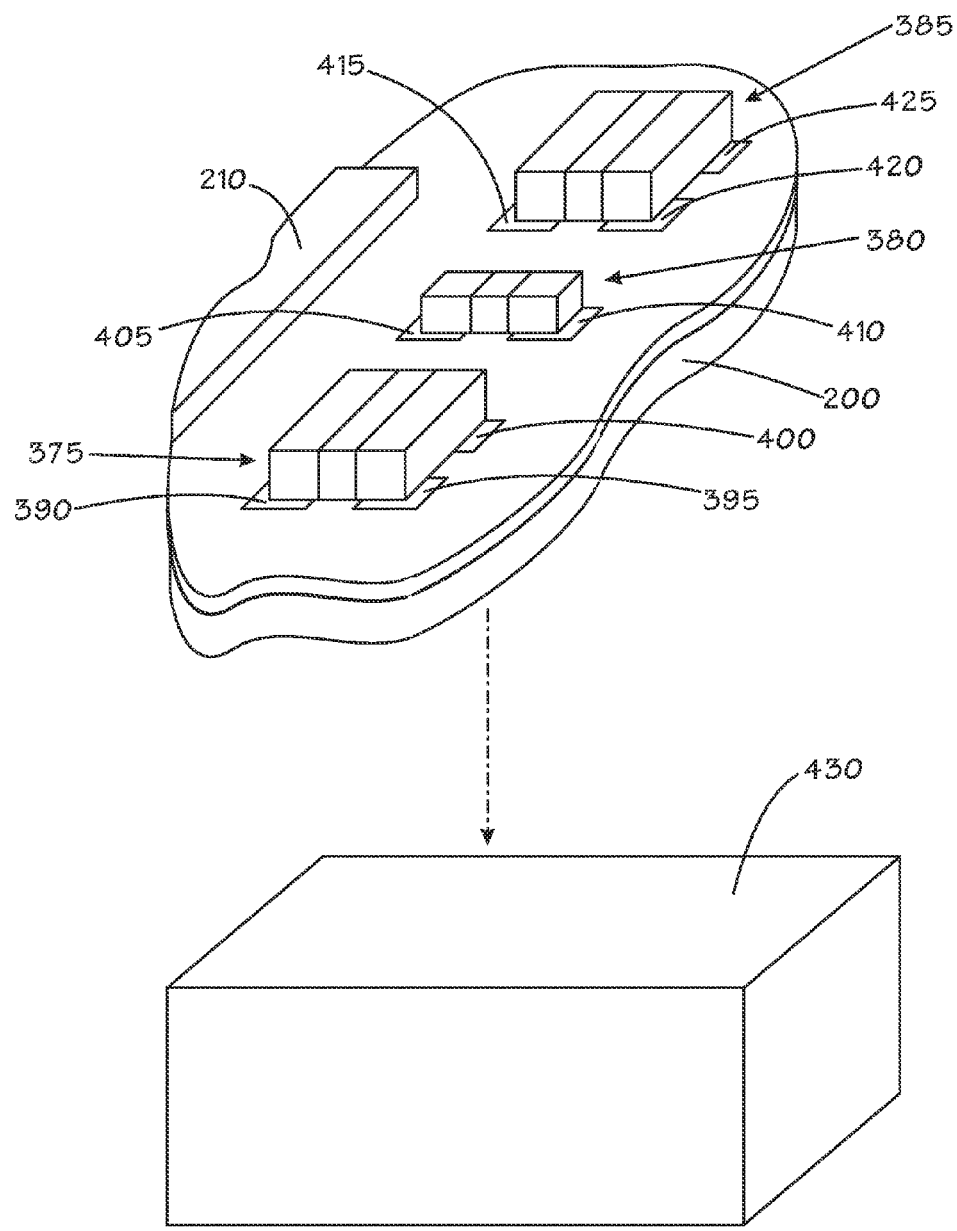
FIG. 12 is a pictorial view of another portion of the semiconductor chip substrate.

A pictorial view of another portion of the substrate 200 is depicted in FIG. 12. A portion of the semiconductor chip 210 that may be mounted on the substrate 200 is visible along with three capacitors 375, 380 and 385. The substrate 200 may be provided with a plurality of solder pads, four of which are grouped beneath the capacitor 375 but only three of which are visible and labeled 390, 395 and 400. The substrate 200 may be provided with two solder pads 405 and 410 adapted to receive the capacitor 380 and a group of four solder pads, three of which are visible and labeled 415, 420 and 425, adapted to receive the capacitor 385. Here again, the solder pads 390, 395, 400, 405, 410, 415, 420 and 425 may all be fabricated based on some nominal size appropriate to match the footprint of a smallest size capacitor to be used with the substrate 200. Different sized capacitors, such as the capacitors 375, 380 and 385, may then be seated on appropriate groupings of the pads 390, 395, 400, 405, 410, 415, 420 and 425 in order to achieve a desired level of total capacitance.

An initial estimate of the total required capacitance $C_{TotalEstimate}$ for the substrate 200 and chip 210 combination may be made using design experience, simulations, prototype testing or other well-known electrical characterization techniques. If the estimate $C_{TotalEstimate}$ turns out to be less than optimal in view of the actual operating characteristics of the semiconductor chip 210, the substrate 200 and some other computing device 430 to which the package substrate 200 may be connected, the actual total required capacitance $C_{TotalActual}$ may be optimized by selecting different sizes of capacitors and connecting those to groupings of the nominally sized solder pads 390, 395, 400, 405, 410, 415, 420 and 425. In this way, the actual total required capacitance $C_{TotalActual}$ may be tailored without discarding or modifying the layout of the substrate 200 and the conductor pads thereof, for example the conductor pads 235, 240, 275 and 280 depicted in FIG. 6. Note that the computing device 430 may be a computer or virtually any other electronic device that utilizes a semiconductor chip.

The skilled artisan will appreciate that not all solder pads on a given chip substrate need be similarly sized. For example, some group of solder pads may be tied to a minimum capacitor terminal size and used for optimizing the decoupling capacitance of the substrate while the remaining solder pads may be fabricated with other sizes. Furthermore, the footprint of a given solder pad may be other than square or rectangular. In addition, there may be more than two solder pads formed on a given conductor pad, particularly where the conductor pad has a much larger footprint than the chosen nominal size for the solder pads. Finally, while the term solder pad has been used in conjunction with the exemplary embodiments disclosed herein, it should be understood that other than solder might be used to establish pathways between a capacitor and an underlying conductor pad.

Any of the exemplary embodiments disclosed herein may be embodied in instructions disposed in a computer readable medium, such as, for example, semiconductor, magnetic disk optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a mask on a semiconductor chip substrate having a first pair of conductor pads and a second pair of conductor pads, the mask having a first plurality of openings exposing selected portions of one of the first pair of conductor pads and a second plurality of openings exposing selected portions of the other of the first pair of conductor pads, each of the first plurality of openings and the second plurality of openings having a footprint corresponding to a footprint of a smallest size terminal of a capacitor adapted to be coupled to the semiconductor chip substrate, wherein the footprint provides the capability to couple different sized capacitors to the semiconductor chip substrate; and
   placing conductor material in the first plurality of openings and the second plurality of openings to establish plural capacitor pads.

2. The method of claim 1, wherein the mask includes a third plurality of openings exposing selected portions of one of the second pair of conductor pads and a fourth plurality of openings exposing selected portions of the other of the second pair of conductor pads, each of the third plurality of openings and the fourth plurality of openings having a footprint corresponding to the footprint of the smallest size terminal of a capacitor adapted to be coupled to the semiconductor chip substrate.

3. A method of manufacturing, comprising:
   forming a mask on a semiconductor chip substrate having a first conductor pad and a second conductor pad larger than the first conductor pad;
   forming a first opening of a first footprint in the mask that exposes a portion of the first conductor pad;
   forming plural second openings of the first footprint in the mask that expose plural portions of the second conductor pad; and
   placing conductor material in the first opening and the plural second openings to establish a first capacitor pad on the first conductor pad and plural second capacitor pads on the second conductor pad, wherein the first footprint provides the capability to couple different sized capacitors to the semiconductor chip substrate.

4. The method of claim 3, comprising coupling a first terminal of a first capacitor to the first capacitor pad and a first terminal of a second capacitor to the plural second capacitor pads.

5. A method of manufacturing, comprising:
   providing a semiconductor chip substrate having plural conductor pads and being adapted to have a semiconductor chip coupled thereto;
   forming a mask on the semiconductor chip substrate, the mask having plural openings including a first opening of a first footprint exposing a first selected portion of one of a first pair of the plural conductor pads and second opening of the first footprint exposing a second selected portion of the other of the first pair of plural conductor pads, and a first plurality of openings of the first footprint exposing selected portions of one of a second pair of the plural conductor pads and a second plurality of openings of the first footprint exposing selected portions of the other of the second pair of the plural conductor pads;
   placing conductor material in the plural openings to establish plural capacitor pads;
   determining a requisite decoupling capacitance for a combination of the semiconductor chip package and the semiconductor chip; and
   coupling plural capacitors to the semiconductor chip substrate, the plural capacitors collectively having the requisite decoupling capacitance, a first of the plural capacitors being coupled to the first pair of the plural conductor pads and a second of the plural capacitors being coupled to the second pair of the plural conductor pads, wherein the first footprint provides the capability to couple different sized capacitors to the semiconductor chip substrate.

6. The method of claim 5, wherein the first capacitor includes first and second terminals and the second capacitor includes third and fourth terminals larger than the first and second terminals.

7. The method of claim 3, wherein the placing conductor material comprises depositing solder into the first opening and the plural second openings.

8. The method of claim 3, wherein the forming the mask comprises placing a stencil on the semiconductor chip substrate, placing an insulating material on the semiconductor chip substrate with the stencil in place, and removing the stencil.

9. The method of claim 3, comprising coupling a semiconductor chip to the semiconductor chip substrate.

10. The method of claim 5, wherein the placing conductor material comprises depositing solder into the plural openings.

11. The method of claim 5, wherein the forming the mask comprising placing a stencil on the semiconductor chip substrate, placing an insulating material on the semiconductor chip substrate with the stencil in place, and removing the stencil.

12. The method of claim 5, comprising coupling a semiconductor chip to the semiconductor chip substrate.

13. The method of claim 12, comprising determining an estimate of the requisite decoupling capacitance prior to coupling the semiconductor chip to the semiconductor chip substrate, and determining the requisite decoupling capacitance after the semiconductor chip is coupled to the semiconductor chip substrate.

* * * * *